(12) United States Patent
Berger

(10) Patent No.: US 7,097,109 B2
(45) Date of Patent: Aug. 29, 2006

(54) CONTACTLESS DATA STORAGE MEDIUM AND METHOD FOR OPERATING CONTACTLESS DATA STORAGE MEDIUM

(75) Inventor: Dominik Berger, Graz (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/090,972

(22) Filed: Mar. 24, 2005

(65) Prior Publication Data

US 2006/0081717 A1    Apr. 20, 2006

Related U.S. Application Data

(63) Continuation of application No. PCT/DE03/02838, filed on Aug. 25, 2003.

(30) Foreign Application Priority Data

Oct. 1, 2002    (DE) ................ 102 45 747

(51) Int. Cl.
*G06K 19/06*    (2006.01)

(52) U.S. Cl. .............. 235/492; 235/451; 713/320; 327/519

(58) Field of Classification Search ......... 235/451; 902/26, 39; 713/320, 322, 323, 324, 330, 713/340; 327/518, 519
See application file for complete search history.

(56) References Cited

U.S. PATENT DOCUMENTS

| | | | |
|---|---|---|---|
| 4,916,333 A * | 4/1990 | Kowalski ............... 326/68 |
| 5,998,978 A * | 12/1999 | Connell et al. ......... 323/273 |
| 6,202,932 B1 * | 3/2001 | Rapeli ................ 235/492 |
| 6,211,786 B1 | 4/2001 | Yang et al. |
| 6,276,609 B1 * | 8/2001 | Czar et al. ............ 235/492 |
| 6,343,022 B1 * | 1/2002 | Naruse ................ 363/16 |
| 6,419,159 B1 * | 7/2002 | Odinak ............... 235/492 |
| 6,427,065 B1 * | 7/2002 | Suga et al. ........... 235/492 |
| 6,677,811 B1 * | 1/2004 | Hayashi ............... 235/492 |
| 6,766,455 B1 * | 7/2004 | Ryan, Jr. .............. 713/189 |
| 6,848,619 B1 * | 2/2005 | Leydier ............... 235/492 |

FOREIGN PATENT DOCUMENTS

| | | | |
|---|---|---|---|
| EP | 1 134 693 A2 | | 9/2001 |
| EP | 1 042 731 B1 | | 10/2001 |
| GB | 2 333 493 A | | 7/1999 |
| JP | 63-65759 A | * | 3/1988 |
| WO | WO 99/66452 A1 | * | 12/1999 |

* cited by examiner

*Primary Examiner*—Jared J. Fureman
(74) *Attorney, Agent, or Firm*—Dickstein, Shapiro, Morin & Oshinsky, LLP.

(57) ABSTRACT

A contactless data storage medium having a principal circuit component and a coupling element, with a controllable load provided for performing offloading modulation. A drawn-current controller is able to reduce the current drawn by the principal circuit component and simultaneously increase the size of the current through the load in order to provide an offloading potential for performing the offloading modulation.

18 Claims, 2 Drawing Sheets

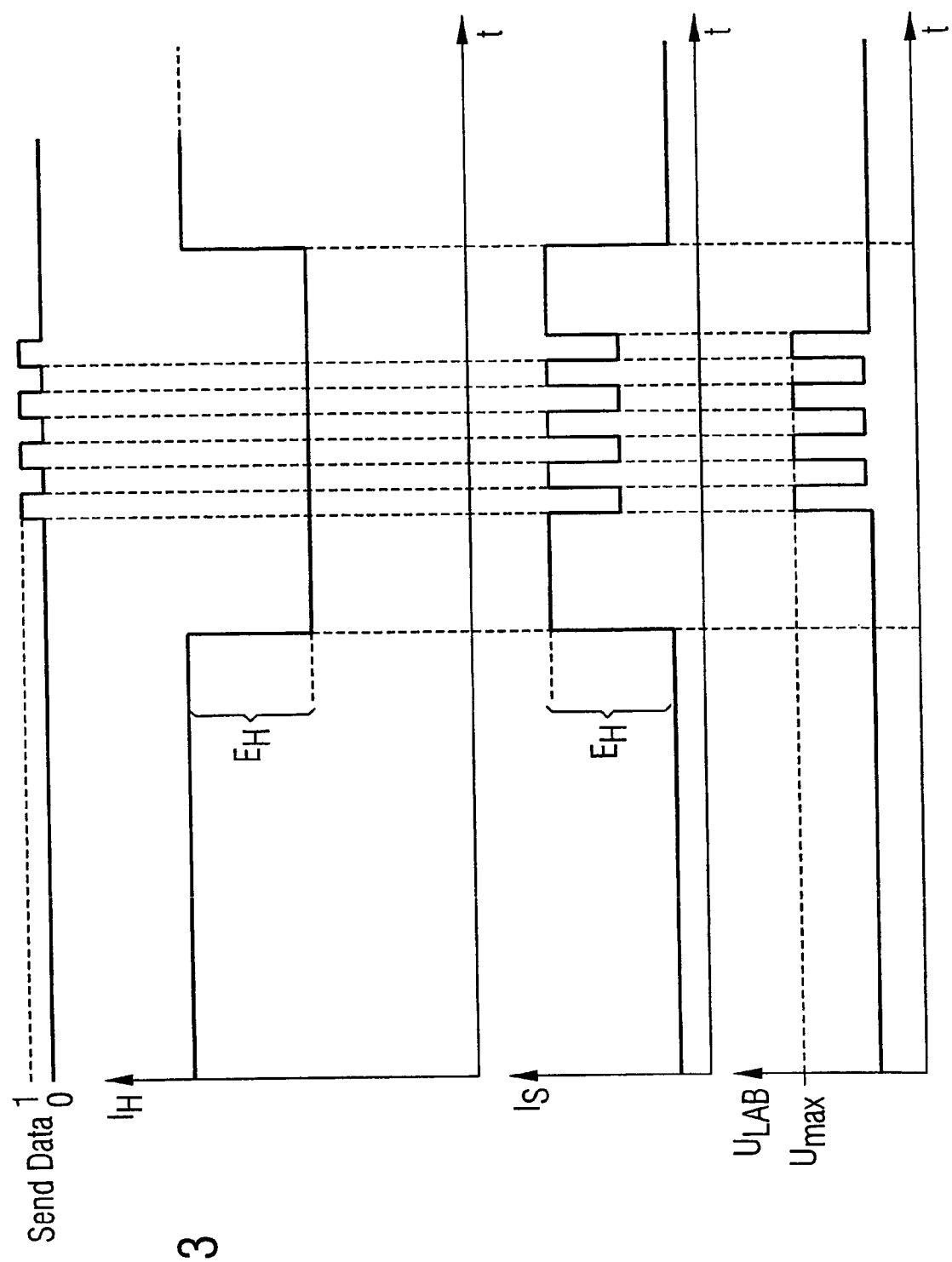

ized equivalently using the features of the dependent claims.

CONTACTLESS DATA STORAGE MEDIUM AND METHOD FOR OPERATING CONTACTLESS DATA STORAGE MEDIUM

CROSS-REFERENCE TO RELATED APPLICATION

This application is a continuation of International Patent Application Serial No. PCT/DE2003/002838, filed Aug. 25, 2003, which published in German on Apr. 15, 2004 as WO 2004/032040, and is incorporated herein by reference in its entirety.

FIELD OF THE INVENTION

The invention relates to a contactless data storage medium, and to a method for operating a contactless data storage medium.

BACKGROUND OF THE INVENTION

To send data from a contactless data storage medium to a read/write unit, it is known practice to vary the power drawn by the contactless data storage medium from the electromagnetic field generated by the read/write unit. The change in power drawn can be detected by the read/write unit and in this way data transmitted by means of appropriate modulation and demodulation can be detected. A currently applicable standard for such contactless data storage media or chip cards is ISO 14443 or ISO 15693. The known data storage media operate using resistive or capacitive loading modulation. For modulation purposes, the size of the load connected in parallel with the principal circuit component is thus increased, so that the power drawn by the contactless data storage medium power increases.

A problem with loading modulation is that the loading for modulation purposes also lowers the voltage which is available for supplying the principal circuit component. This can result in operating faults, for example as a result of an undervoltage detector circuit responding or else the clock detection circuit, which evaluates a clock signal transmitted using the electromagnetic field from the read/write unit, failing. Although it is possible to keep down the power level change, that is to say the level of load connection, a minimum modulation amplitude is required in order for the read/write unit to be able to detect the modulation. Overall, the loading modulation results in unwanted range limitation. Under these constraints, the load resistors are normally dimensioned with a compromise.

In addition, nonlinear modulation is also known, where the depth of modulation decreases before the supply voltage reaches the lower permissible voltage threshold. In the case of this form of a contactless data storage medium too, however, the modulation signal becomes weaker, which means that the likelihood of erroneous data transmission increases.

To get around these problems, it is known practice to provide offloading modulation instead of loading modulation. A contactless data storage medium operating on the basis of such a method is known from EP 1 042 731 B1, for example. The circuit shown in this document is provided with a shunt transistor which can be connected and disconnected. In this case, the power level change is dependent on the power dissipated in the shunt. In a normal operating state, when no data are intended to be sent, the shunt is connected and increases the current drawn by the contactless data storage medium. For modulation purposes, the shunt is disconnected, which results in a reduction in the drawn current, which in turn can be detected by the read/write unit. In the read/write unit, the contactless data storage medium's modulation signals are AC coupled, so that just the spectral amplitude of the modulation sidebands is taken into account. It therefore does not matter whether loading or offloading modulation takes place, which means that contactless data storage media operating on the basis of the principle of offloading modulation are also compatible with the existing read/write units. If the shunt has been disconnected in order to obtain the greatest possible range for the read mode, the shunt is not active and therefore also cannot be offloaded. It is therefore no longer possible to send data. In addition, the load connected in the normal operating state results in unwanted range limitation.

SUMMARY OF THE INVENTION

It is an object of the present invention to specify a contactless data storage medium in which unnecessary dissipation of power can be avoided and the data storage medium can be configured for optimum range. It is likewise an object of the invention to specify a corresponding method.

The contactless data storage medium has a principal circuit component, a coupling element and a controllable load which is connected in parallel with the principal circuit component, where the principal circuit component has a modulation controller which is able to reduce the controllable load for the purpose of load modulation.

In the method for operating a contactless data storage medium, a principal circuit component has a controllable load connected in parallel with it, and data are returned through offloading modulation.

BRIEF DESCRIPTION OF THE DRAWINGS

The invention is explained in more detail below using an exemplary embodiment. In the figures:

FIG. 3 shows a signal graph for the circuits in FIGS. 1 and 2.

DETAILED DESCRIPTION OF PREFERRED EMBODIMENTS OF THE INVENTION

It is an object of the present invention to specify a contactless data storage medium in which unnecessary dissipation of power can be avoided and the data storage medium can be configured for optimum range. It is likewise an object of the invention to specify a corresponding method.

The invention achieves this object by means of a contactless data storage medium of the type mentioned initially which is characterized in that a drawn-current controller is provided which is able to reduce the current drawn by the principal circuit component and is able to increase the size of the load for the purpose of producing a constant drawn current. For the method, this object is achieved by a method of the type mentioned initially which is characterized in that in a normal operating state the controllable load is set to a first low value, load modulation for sending data is preceded by reduction of the current drawn by the principal circuit component and simultaneous increase of the size of the load in order to produce a constant drawn current, the purpose of load modulation for sending data is served by reducing the controllable load on the basis of the data which are to be sent, and the sending of data is followed by the current drawn by the principal circuit component being increased again and the load being reduced to the first value.

An advantage of the inventive data storage medium and of the inventive method is that power is not constantly being dissipated, which results in a reduction in range. Instead, use is made of the fact that the time in which data are being sent is relatively short and, particularly during the send mode, power saving measures can be implemented which can be provided for a power level change for the purpose of offloading modulation. Since the lowering of the drawn current is relatively slow as compared with the modulation signal itself, the power initially obtained is dissipated in the connected or increased load, and the offloading modulation takes place through rapid offloading, in which the load is disconnected or reduced.

Advantageous measures for reducing the drawn current are reducing the clock frequency or disconnecting modules within the principal circuit component which are temporarily unused, particularly when data are returned.

Figure 1:
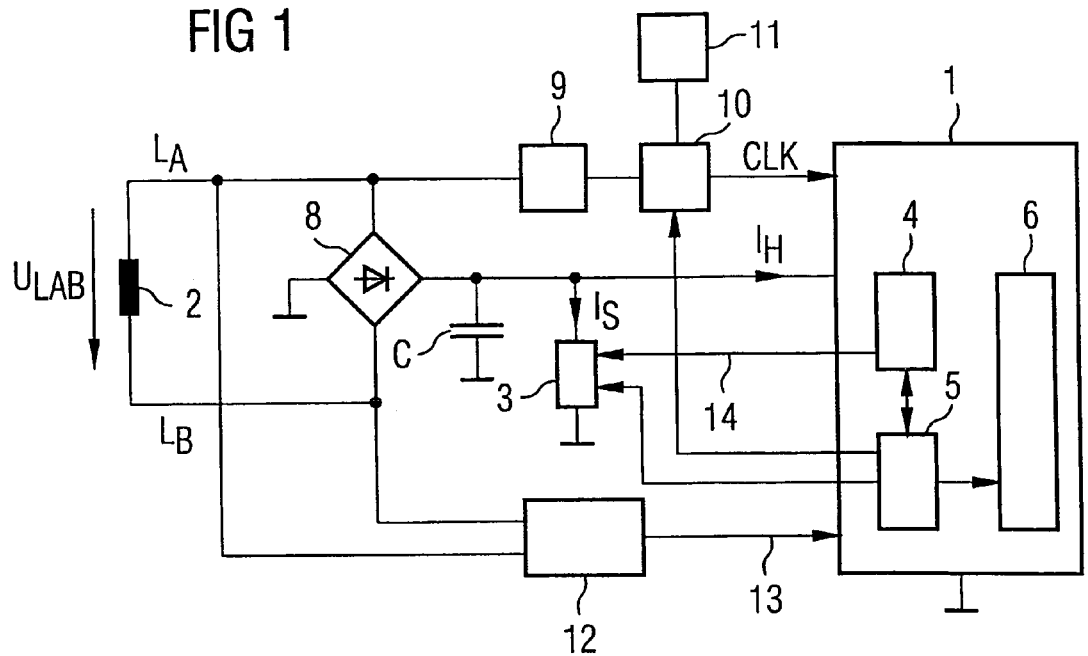
FIG. 1 shows a first embodiment of a contactless data storage medium in accordance with the invention.

It is also advantageous for the modulation controller to reduce the load until a predetermined, maximum permissible voltage has been reached on the coupling element. This means that the largest possible modulation amplitude is always obtained. FIG. 1 shows a first exemplary embodiment of a contactless data storage medium in accordance with the invention. The data storage medium has a coupling element 2 in the form of a coil in which an electromagnetic field generated by a read/write unit induces a voltage. The electromagnetic field is used to transmit not only data but also the power which the contactless data storage medium requires for operation. The connections LA and LB of the coupling element 2 have a demodulator 12 connected to them which extracts the transmitted data from the voltage induced in the coil 2 and makes them available in the form of a data signal 13 to a principal circuit component 1. The connections LA and LB of the coil 2 likewise have a rectifier 8 connected to them which uses the induced AC voltage to generate a DC voltage which is required for operating the principal circuit component and the other circuit components of the data storage medium. A backup capacitor C provides the smoothing for the rectified AC voltage. The principal circuit component 1 contains functional units which perform the data processing and, by way of example, a modulation controller 4. Operation of the principal circuit component 1 requires a current $I_H$, which is supplied by the rectifier circuit 8.

In addition, the electromagnetic field transmits a clock signal which is evaluated by a clock detection apparatus 9 connected to the coil 2 for this purpose. The frequency provided by the clock detection apparatus 9 is too high for it to be able to be used as a clock signal by the principal circuit component 1. For this reason, the clock detection apparatus 9 has a downstream divider 10 which, as a result of an appropriate clock ratio being set, generates a suitable clock signal CLK which is supplied to the principal circuit component 1. In order to obtain a constant, exact clock frequency, the divider 10 in the exemplary embodiment in FIG. 1 is connected to a tracking synchronization apparatus (phase locked loop, PLL).

In general, bidirectional communication between a read/write unit and the contactless data storage medium is necessary; data thus also needs to be transmitted in the opposite direction. In the data storage media on which the invention is based, this is done by means of load modulation; the load seen by the read/write unit as a result of the contactless data storage medium is thus altered. To this end, a controllable load 3 is provided which, in the circuit in FIG. 1, is connected to the output of the rectifier 8 and is situated directly in parallel with the principal circuit component 1. The controllable load can be actuated by the modulation controller 4. To transmit data, the load 3 is changed, so that the current $I_S$ flowing through the load 3 changes as prescribed by the modulation. The current through the coil 2, which current is made up of the currents $I_S$ and $I_H$ through the load 3 and through the principal circuit component 1, thus fluctuates on the basis of the modulation. This load fluctuation can be detected by the read/write unit. The controllable load 3 is generally a transistor which has, by way of example, a resistor or a capacitor connected in series with it.

In the case of a contactless data storage medium, which is what the invention is based on, the load modulation takes place in the form of offloading modulation. Thus, if a signal needs to be transmitted, the load 3 is reduced, which means that the current $I_S$ decreases, which the read/write unit perceives as offloading. To be able to reduce a load, however, a load first needs to be present. While a constant current flows through the load 3 for this purpose in circuits based on the prior art, and this current consumes power, the invention provides for no current to be allowed to flow through the load 3 in the normal operating state, that is to say when no data are being sent, which means that $I_S$ is equal to zero. Before data are sent, however, the current $I_S$ through the load 3 needs to be increased so that rapid offloading is possible for the purpose of data transmission. Since not the total current $I_S+I_H$ will be increased, however, the current $I_H$ through the principal circuit components 1 needs to be reduced at the same time as $I_S$ increases.

This is achieved by a drawn-current controller 5. This is set up to reduce the current drawn by the principal circuit component. In the case in FIG. 1, this is done by influencing the division ratio of the divider 10, so that the clock frequency at which the principal circuit component operates is reduced. This automatically lowers the current drawn by the principal circuit component 1. Another measure for reducing drawn current involves disconnecting temporarily unneeded components 6. By way of example, components which are provided just for receiving data are superfluous when data are being sent. Disconnecting such loads reduces the current $I_H$ further. The drawn-current controller 5 actuates the controllable load 3 in a corresponding manner, so that the sum of the drawn current saved in the principal circuit component 1 corresponds to the increased current through the load 3. The total drawn current, that is to say the current flowing through the coil 2, remains the same as a result.

In order to send data at this point, the loading by the current $I_S$ through the load 3 is briefly reduced, so that the current through the coil 2 falls and the offloading can be detected by the read/write unit as data transmission. The power level change produced in this way is much greater than that as a result of purely disconnecting a shunt, as is the case in circuits based on the prior art. The invention limits the nonsensical consumption of power in the load 3, which is intended to provide a means of offloading, just to the time in which data need to be sent, whereas the prior art involves constant nonsensical consumption of power.

Figure 2:
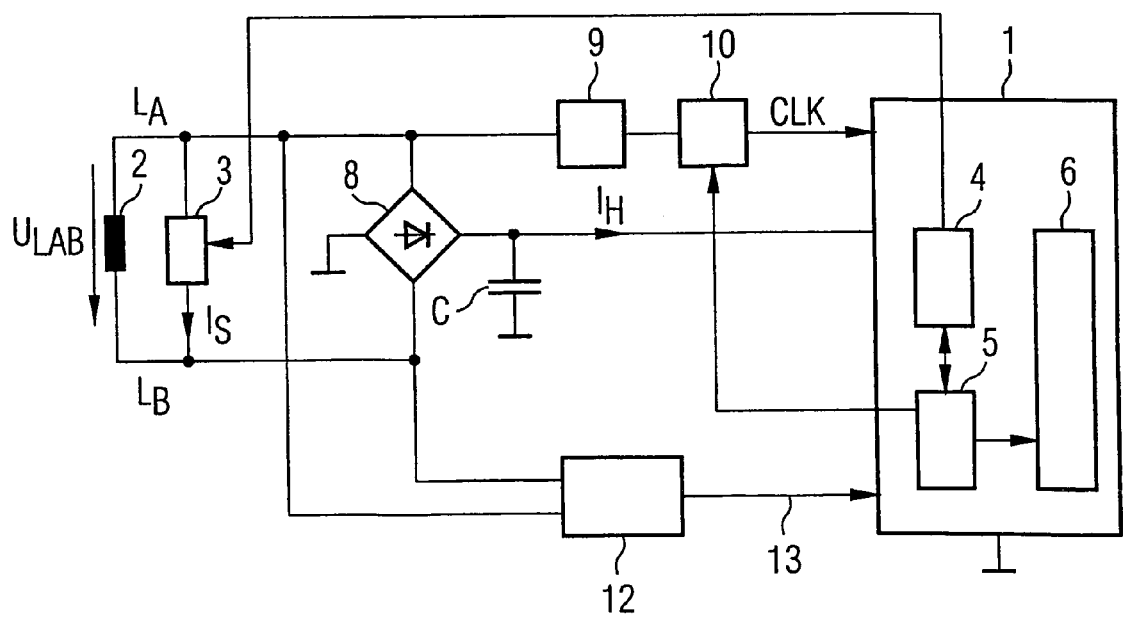
FIG. 2 shows a second embodiment of a data storage medium.

FIG. 2 shows a second exemplary embodiment of a contactless data storage medium in accordance with the invention. A tracking synchronization apparatus has been dispensed with in the exemplary embodiment in FIG. 2. The actual difference, however, is that the controllable load 3 is not connected downstream of the rectifier 8, but rather the load 3 is connected directly to the connections of the coil 2. In this case, there is thus no direct parallel connection of the controllable load 3 and the principal circuit component 1, but rather the rectifier circuit is also connected in between. The effect achieved is nevertheless the same. In this exemplary embodiment too, the current through the coil 2 is made up of the current $I_S$ through the load 3 and the current $I_H$ through the principal circuit component 1. The drawn current by the demodulator 12 and the clock detection apparatus 9 is negligible in this case.

Another difference is the actuation of the controllable load 3. Whereas, in the exemplary embodiment in FIG. 1, both the modulation controller 4 and the drawn-current controller 5 were actuated, the exemplary embodiment in FIG. 2 has provision for the drawn-current controller 5 to actuate the modulation controller 4, which is in turn connected to the controllable load 3 via line 14. In this case, the actuation by the modulation controller 4 is effected in such a way that both the data to be sent and the stipulation by the drawn-current controller 5 are combined to produce a common control signal.

The whole sequence can be shown particularly clearly using the signal graph in FIG. 3. One below the other, the figure shows the logic representation of the SEND DATA signal which is to be sent, below that the current $I_H$ through the principal circuit component 1, below that the current $I_S$ through the controllable load 3, and right at the bottom in FIG. 3 the voltage $U_{LAB}$ across the coupling element, that is to say the coil 2. The time at which data are intended to be sent is known in advance in the principal circuit component 1. At a sufficiently great interval of time before the first data are sent, the current $I_H$ through the principal circuit component 1 is lowered by an amount EH, the "power level change". At the same time, the current $I_S$ through the controllable load 3 is increased by the same amount EH. As a result, no change occurs on the coil 2, as can be seen from the voltage $U_{LAB}$.

If a logic 1 now needs to be sent, the load is reduced and accordingly the current $I_S$ through the load 3 is lowered. Since the current $I_H$ through the principal circuit component 1 remains the same, this becomes noticeable through a change in current in the coil 2 and hence also in a change in the voltage $U_{LAB}$ across the connections LA and LB of the coil. In this case, the current $I_S$ through the load 3 is lowered to the extent to which an increase in the voltage $U_{LAB}$ is permissible, i.e. a value $U_{max}$ must not be exceeded. On account of the greatest possible offloading always being provided, as provided in one advantageous embodiment, the modulation amplitude is as great as possible and errors in the data transmission are avoided. At the same time, a mode of operation which is optimized for range is always ensured.

After the period of time in which the data are sent, the drawn-current controller 5 reconnects the disconnected functional units, and increases the clock frequency CLK. At the same time, the current $I_S$ through the controllable load 3 is reduced, so that the normal operating state is subsequently restored. All of the functional units are now available again at a maximum processing speed for the purpose of receiving and processing data.

What is claimed is:

1. A contactless data storage medium comprising:
a coupling element;
a controllable load; and
a principal circuit component connected in parallel with the controllable load,
wherein the principal circuit component has a modulation controller, which is able to reduce the size of the controllable load for load moderating, and a drawn-current controller, which is able to reduce the current drawn by the principal circuit component and increase the size of the controllable load to maintain a constant total drawn current.

2. The contactless data storage medium as claimed in claim 1, wherein the current drawn by the principal circuit component can be reduced in order to reduce clock frequency.

3. The contactless data storage medium as claimed in claim 1, wherein the current drawn by the principal circuit component is reduced by disconnecting functional units which are temporarily not in use.

4. The contactless data storage medium as claimed in claim 1, wherein the load is reduced by the modulation controller until a predetermined maximum permissible voltage has been reached on the coupling element.

5. The data storage medium as claimed in claim 1, wherein the controllable load is connected to connections of the coupling element.

6. The contactless data storage medium as claimed in claim 1, wherein the controllable load is connected to a DC voltage outputs on a rectifier.

7. The contactless data storage medium as claimed in claim 1, wherein a clock detection apparatus having a downstream divider is provided in order to provide a clock frequency for the principal circuit component, the divider having a tracking synchronization apparatus connected thereto for adjusting the clock frequency.

8. A method for operating a contactless data storage medium, in which a principal circuit component and a controllable load are connected in parallel, and in which data are sent through offloading modulation, the method comprising the steps of:
setting the controllable load to a first low value;
reducing current drawn by the principal circuit component and simultaneously increasing the size of the controllable load in order to maintain a constant total drawn current;
performing load modulation for sending data by reducing the controllable load based on data to be sent; and
increasing the current drawn by the principal circuit component, and simultaneously returning the controllable load to the first low value.

9. The method as claimed in claim 8, wherein the first low value corresponds to disconnection of the load.

10. The method as claimed in claim 8, wherein the step of reducing current drawn by the principal circuit component comprises the step of reducing clock frequency.

11. The method as claimed in claim 8, wherein the step of reducing current drawn by the principal circuit component comprises the step of disconnecting temporarily unused functional units within the principal circuit component.

12. A contactless data storage medium comprising:
a coupling element;
a controllable load means; and
a principal circuit component connected in parallel with the controllable load means,
wherein the principal circuit component has a modulation controlling means, which is able to reduce the size of the controllable load means for load moderating, and a drawn-current controlling means, which is able to reduce the current drawn by the principal circuit component and increase the size of the controllable load means to maintain a constant total drawn current.

13. The contactless data storage medium as claimed in claim 12, wherein the current drawn by the principal circuit component can be reduced in order to reduce clock frequency.

14. The contactless data storage medium as claimed in claim 12, wherein the current drawn by the principal circuit component is reduced by disconnecting functional units which are temporarily not in use.

15. The contactless data storage medium as claimed in claim 12, wherein the load means is reduced by the modulation controlling means until a predetermined maximum permissible voltage has been reached on the coupling element.

16. The data storage medium as claimed in claim 12, wherein the controllable load means is connected to connections of the coupling element.

17. The contactless data storage medium as claimed in claim 12, wherein the controllable load means is connected to a DC voltage outputs on a rectifier.

18. The contactless data storage medium as claimed in claim 12, wherein a clock detection means having a downstream dividing means is provided in order to provide a clock frequency for the principal circuit component, the dividing means having a tracking synchronization means connected thereto for adjusting the clock frequency.

* * * * *

UNITED STATES PATENT AND TRADEMARK OFFICE
CERTIFICATE OF CORRECTION

| | |
|---|---|
| PATENT NO. | : 7,097,109 B2 |
| APPLICATION NO. | : 11/090972 |
| DATED | : August 29, 2006 |
| INVENTOR(S) | : Dominik Berger |

It is certified that error appears in the above-identified patent and that said Letters Patent is hereby corrected as shown below:

In the Claims:

Claim 6, column 6, line 27, "outputs" should read --output--

Claim 17, column 8, line 6, "outputs" should read --output--

Signed and Sealed this

Ninth Day of January, 2007

JON W. DUDAS
*Director of the United States Patent and Trademark Office*